(12) United States Patent
You

(10) Patent No.: US 11,637,260 B2
(45) Date of Patent: Apr. 25, 2023

(54) QUANTUM DOT-BASED DISPLAY PANEL AND METHOD FOR FABRICATING THE SAME, AND DISPLAY DEVICE

(71) Applicant: BOE TECHNOLOGY GROUP CO., LTD., Beijing (CN)

(72) Inventor: Juanjuan You, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/208,033

(22) Filed: Mar. 22, 2021

(65) Prior Publication Data
US 2021/0376272 A1  Dec. 2, 2021

(30) Foreign Application Priority Data

May 26, 2020 (CN) .......................... 202010456483.1

(51) Int. Cl.
*H01L 51/50* (2006.01)
*H01L 27/32* (2006.01)
*H01L 51/56* (2006.01)

(52) U.S. Cl.
CPC ........ *H01L 51/502* (2013.01); *H01L 27/3213* (2013.01); *H01L 51/5036* (2013.01); *H01L 51/56* (2013.01)

(58) Field of Classification Search
CPC .......................... H01L 51/502; H01L 27/3213
See application file for complete search history.

(56) References Cited

U.S. PATENT DOCUMENTS

| | | | |
|---|---|---|---|
| 10,923,672 B1* | 2/2021 | Li | H01L 51/5268 |
| 11,069,751 B2* | 7/2021 | Kim | H01L 27/322 |
| 2015/0185381 A1* | 7/2015 | Wu | G02F 1/133617 977/774 |
| 2018/0341160 A1* | 11/2018 | Gong | H01L 27/124 |

(Continued)

FOREIGN PATENT DOCUMENTS

| | | |
|---|---|---|
| CN | 105204103 A | 12/2015 |
| CN | 106918941 A | 7/2017 |

(Continued)

OTHER PUBLICATIONS

Chinese Office Action dated Aug. 23, 2022 in corresponding Chinese Patent Application No. 202010456483.1 (with English translation), 17 pages.

*Primary Examiner* — Caleb E Henry
(74) *Attorney, Agent, or Firm* — Xsensus LLP

(57) ABSTRACT

The present disclosure provides a quantum dot-based display panel, a method and a display device. A pixel of the display panel includes four sub-pixels of R, G, B and W, each of which uses blue light as backlight, both the red sub-pixel and the green sub-pixel include quantum dots, the blue sub-pixel includes a light transmitting layer, and a white sub-pixel includes a yellow light conversion layer. Quantum dots of the yellow light conversion layer are configured to convert a portion of the blue light to yellow light and at the same time transmit the other portion of the blue light such that the obtained yellow light and the transmitted blue light are mixed to form white light. Thereby, R, G, B and W four-color display based on the quantum dots is realized, which enhances the richness of color, display brightness and resolution, the utilization ratio of backlight.

18 Claims, 6 Drawing Sheets

(56) References Cited

U.S. PATENT DOCUMENTS

| | | | |
|---|---|---|---|
| 2019/0088723 A1* | 3/2019 | Shi | H01L 33/504 |
| 2019/0325813 A1* | 10/2019 | Lo | G09G 3/2003 |
| 2020/0027928 A1* | 1/2020 | Wu | H01L 27/322 |
| 2021/0066629 A1* | 3/2021 | Li | H01L 27/322 |

FOREIGN PATENT DOCUMENTS

| | | |
|---|---|---|
| CN | 109103344 A | 12/2018 |
| CN | 111048556 A | 4/2020 |

* cited by examiner

QUANTUM DOT-BASED DISPLAY PANEL AND METHOD FOR FABRICATING THE SAME, AND DISPLAY DEVICE

CROSS-REFERENCE TO RELATED APPLICATIONS

This application is based on and claims priority to Chinese Patent Application No. 202010456483.1 filed on May 26, 2020, the entire contents of which being hereby incorporated by reference for all purposes.

TECHNICAL FIELD

The present disclosure relates to display technologies and, more particularly, to a quantum dot-based display panel, a method for fabricating the same, and a display device.

BACKGROUND

Quantum dot materials have many advantages, such as wide emission spectrum coverage range, stable optical properties, narrow emission half-peak width, and high luminous efficiency, and may be used in many electroluminescent and photoluminescent devices as displays, lighting, solar cells, and biosensors, for example.

In currently proposed technologies, quantum dots (QD) may be combined with organic electroluminescent display technology (OLED) to obtain QD-OLED display devices, and its principle is that OLED light-emitting materials are used as backlight, such that light emitted from the backlight is converted by quantum dots to realize full color. However, the color effect, resolution, and backlight utilization ratio of the current QD-OLED display devices still need to be improved.

It should be noted that information disclosed in this part are provided only for acquiring a better understanding of the background of the present disclosure and therefore may include information that is not current technology already known to those of ordinary skill in the art.

SUMMARY

It is an objective of the present disclosure to provide a quantum dot-based display panel and a method for fabricating the same, and a display device, and at least partially to solve one or more problems in current technology.

According to a first aspect of the present disclosure, there is provided a quantum dot-based display panel, wherein the display panel comprises pixels arranged in an array, at least a portion of the pixels comprises red sub-pixels, green sub-pixels, blue sub-pixels and white sub-pixels, and the display panel further includes:

a substrate;

a packaging layer, provided opposite to the substrate;

a plurality of light-emitting devices, disposed between the substrate and the packaging layer, and provided at the respective sub-pixels in one-to-one correspondence, wherein the light-emitting devices is configured to emit blue light toward the packaging layer; and a light conversion layer, provided between the light-emitting devices and the packaging layer, wherein the light conversion layer includes a first red quantum dot layer corresponding to the red sub-pixels, a first green quantum dot layer corresponding to the green sub-pixels, a light transmitting layer corresponding to the blue sub-pixels, and a yellow light conversion layer corresponding to the white sub-pixels;

wherein the first red quantum dot layer is configured to convert blue light emitted by the light-emitting device of the corresponding sub-pixel to red light, the first green quantum dot layer is configured to convert blue light emitted by the light-emitting device of the corresponding sub-pixel to green light, the light transmitting layer is configured to transmit blue light emitted by the light-emitting device of the corresponding sub-pixel, and the yellow light conversion layer includes quantum dots and the quantum dots are configured to convert a portion of blue light emitted by the light-emitting device of the corresponding sub-pixel to yellow light, and at the same time transmit the other portion of the blue light, to mix the obtained yellow light and the blue light transmitting through the yellow light conversion layer to form white light.

In an exemplary embodiment of the present disclosure, the light transmitting layer is one of an air layer, a transparent material layer, and a transparent material layer in which reflective particles for reflecting blue light to a light outgoing surface are added.

In an exemplary embodiment of the present disclosure, the yellow light conversion layer includes a second red quantum dot layer and a second green quantum dot layer that are laminated; the second red quantum dot layer is configured to convert a portion of blue light emitted by the light-emitting device of a corresponding sub-pixel to red light and at the same time transmit the other portion of the blue light; the second green quantum dot layer is configured to convert a portion of the blue light emitted by the light-emitting device of the corresponding sub-pixel to green light and at the same time transmit the other portion of the blue light, such that the obtained red light and green light are mixed to form yellow light, and the yellow light and blue light transmitting through the yellow light conversion layer are mixed to form white light.

In an exemplary embodiment of the present disclosure, the second red quantum dot layer is provided on one side of the light-emitting device distal to the substrate, and the second green quantum dot layer is provided on one side of the second red quantum dot layer distal to the light-emitting device;

wherein the second red quantum dot layer is configured to convert a portion of the blue light emitted by the light-emitting device of the corresponding sub-pixel to red light and at the same time transmit the other portion of the blue light; the second green quantum dot layer is configured to convert a portion of the blue light transmitting through the second red quantum dot layer of the corresponding sub-pixel to green light, and at the same time transmit the other portion of the blue light and transmit the red light emitted by the second red quantum dot layer such that the obtained red light and green light are mixed to form yellow light, and the yellow light and the blue light transmitting through the yellow light conversion layer are mixed to form white light.

In an exemplary embodiment of the present disclosure, the second green quantum dot layer is provided on one side of the light-emitting device distal to the substrate and the second red quantum dot layer is provided on one side of the second green quantum dot layer distal to the light-emitting device;

wherein the second green quantum dot layer is configured to convert a portion of the blue light emitted by the light-emitting device of the corresponding sub-pixel to green light and at the same time transmit the other portion of the blue light; the second red quantum dot layer is configured to convert a portion of the blue light transmitting through the second green quantum dot layer of the corresponding sub-pixel to red light, and convert a portion of the green light emitted by the second green quantum dot layer to red light, and at the same time transmit the other portion of the green light and the other portion of the blue light, such that the obtained red light and green light are mixed to form yellow light, and the yellow light and the blue light transmitting through the yellow light conversion layer are mixed to form white light.

In an exemplary embodiment of the present disclosure, the yellow light conversion layer includes mixed red quantum dots and green quantum dots, the green quantum dots are configured to convert a portion of blue light emitted by the light-emitting device of a corresponding sub-pixel to green light and at the same time transmit another portion of the blue light, and the red quantum dots are configured to convert a portion of blue light emitted by the light-emitting device of a corresponding sub-pixel to red light and convert a portion of the green light emitted by the green quantum dots to red light and at the same time transmit another portion of the blue light, such that the obtained red light and green light are mixed to form yellow light, and the yellow light and the blue light transmitting through the yellow light conversion layer are mixed to form white light.

In an exemplary embodiment of the present disclosure, the yellow light conversion layer includes yellow quantum dots, the yellow quantum dots being configured to convert a portion of blue light emitted by the light-emitting device of a corresponding sub-pixel to yellow light, and at the same time transmit the other portion of the blue light, such that the obtained yellow light and the blue light transmitting through the yellow light conversion layer are mixed to form white light.

In an exemplary embodiment of the present disclosure, a thickness of the second green quantum dot layer is less than that of the first green quantum dot layer, and/or, a concentration of green quantum dots in the second green quantum dot layer is less than that of green quantum dots in the first green quantum dot layer.

In an exemplary embodiment of the present disclosure, a concentration of green quantum dots in the yellow light conversion layer is less than that of green quantum dots in the first green quantum dot layer.

In an exemplary embodiment of the present disclosure, the packaging layer is a packaging cover plate, and the light conversion layer is provided on one side of the packaging cover plate, facing toward the substrate.

In an exemplary embodiment of the present disclosure, the display panel further includes:

a filtering layer, including a red filtering layer corresponding to the red sub-pixels and a green filtering layer corresponding to the green sub-pixels, wherein the red filtering layer is provided between the first red quantum dot layer and the packaging cover plate, and the green filtering layer is provided between the first green quantum dot layer and the packaging cover plate.

In an exemplary embodiment of the present disclosure, the display panel further includes:

a black mask, provided on one side of the packaging cover plate, facing toward the substrate, wherein the black mask includes a plurality of shielding portions, and each of the plurality of shielding portions is located between adjacent sub-pixels.

According to another aspect of the present disclosure, there is provided a method for fabricating a display panel, wherein the display panel includes pixels arranged in an array, at least a portion of the pixels includes red sub-pixels, green sub-pixels, blue sub-pixels, and white sub-pixels, and the method includes:

providing a substrate;

forming a plurality of light-emitting devices on the substrate, wherein the plurality of light-emitting devices are provided at the respective sub-pixels in one-to-one correspondence, and the light-emitting devices are configured to emit blue light in a direction distal to the substrate;

forming a light conversion layer on one side of the light-emitting devices distal to the substrate, wherein the light conversion layer includes a first red quantum dot layer corresponding to the red sub-pixels, a first green quantum dot layer corresponding to the green sub-pixels, a light transmitting layer corresponding to the blue sub-pixels, and a yellow light conversion layer corresponding to the white sub-pixels, wherein the first red quantum dot layer is configured to convert blue light emitted by the light-emitting device of the corresponding sub-pixel to red light, the first green quantum dot layer is configured to convert blue light emitted by the light-emitting device of the corresponding sub-pixel to green light, the light-transmitting layer is configured to transmit blue light emitted by the light-emitting device of the corresponding sub-pixel, the yellow light conversion layer includes quantum dots and the quantum dots are configured to convert a portion of blue light emitted by the light-emitting device of the corresponding sub-pixel to yellow light and at the same time transmit the other portion of the blue light, such that the obtained yellow light and the blue light transmitting through the yellow light conversion layer are mixed to form white light; and forming a packaging layer on one side of the light conversion layer distal to the light-emitting devices.

In an exemplary embodiment of the present disclosure, the packaging layer is a packaging cover plate, and the fabricating method further includes:

forming a filtering layer on the packaging cover plate, wherein the filtering layer includes a red filtering layer corresponding to the red sub-pixels and a green filtering layer corresponding to the green sub-pixels, wherein, in forming the light conversion layer, the first red quantum dot layer is formed on one side of the red filtering layer distal to the packaging cover plate, and the first green quantum dot layer is formed on one side of the green filtering layer distal to the packaging cover plate; and providing the substrate on which the light-emitting devices are formed and the packaging cover plate on which the filtering layer and the light conversion layer are formed, opposite to each other to form a paired box.

According to a further another aspect of the present disclosure, there is provided a display device, the display device includes the display panel as described above.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute part of this specification, illustrate embodiments consistent with the disclosure and, together with the description, serve to explain the principles of the disclosure. Apparently, the drawings in the following description are only for illustrating some embodiments of the present disclosure and those of ordinary skill in the art can further derive other drawings based on the drawings without paying any creative labor.

DETAILED DESCRIPTION

Figure 1:
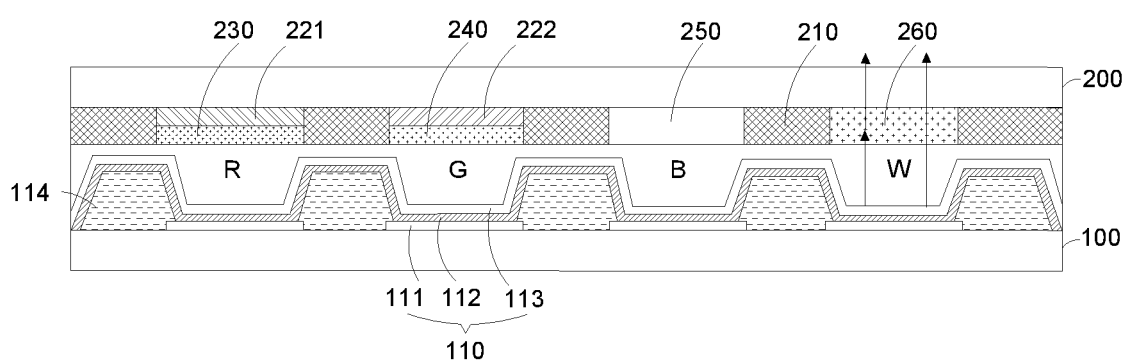
FIG. 1 is a structural schematic diagram illustrating a display panel according to an embodiment of the present disclosure.

Exemplary embodiments will now be fully described by reference to the accompanying drawings. However, the exemplary embodiments can be implemented in various forms and should not be understood as being limited to the examples set forth herein; rather, the embodiments are provided so that the disclosure will be thorough and complete, and the conception of exemplary embodiments will be fully conveyed to those skilled in the art. The same reference signs in the drawings denote the same or similar structures and detailed description thereof will be omitted.

Although terms having opposite meanings such as "on" and "below" are used herein to describe the relationship of one component relative to another component, such terms are used herein only for the sake of convenience, for example, in the direction illustrated in the figures. It can be understood that if a device denoted in the drawings is turned upside down, a component referred to as "on" something will be referred to as "below" something. When a structure is referred to as "on" another structure, it probably means that the structure is integrally formed on another structure, or the structure is "directly" disposed on another structure, or the structure is "indirectly" disposed on another structure through a further structure.

Terms such as "one", "an/a", "the", "said" and "at least one" are used herein to indicate the presence of one or more elements/component parts/and others. Terms "including" and "having" have an inclusive meaning which means that there may be additional elements/component parts/and others in addition to the listed elements/component parts/and others.

The following reference numerals are used in the figures: 100—substrate; 110—light-emitting device, 111—anode layer; 112—organic light-emitting material layer; 113—cathode layer; 114—pixel definition layer; 200—packaging layer; 210—black mask; 221—red filtering layer; 222—green filtering layer; 230—first red quantum dot layer; 240—first green quantum dot layer; 250—light transmitting layer; 260—yellow light conversion layer; 261—second red quantum dot layer; 262—second green quantum dot layer.

Embodiments of the present disclosure provide a quantum dot-based display panel. As shown in FIG. 1, the display panel includes pixels arranged in an array and at least a portion of the pixels include red sub-pixels R, green sub-pixels G, blue sub-pixels B, and white sub-pixels W. The display panel includes a substrate 100 and a packaging layer 200 provided opposite to each other, with a plurality of light-emitting devices 110 provided between the substrate 100 and the packaging layer 200. The plurality of light-emitting devices 110 are provided at the sub-pixels in one-to-one correspondence, and are configured to emit blue light to the packaging layer 200. The light-emitting devices 110 and the packaging layer 200 are further provided with a light conversion layer therebetween. The light conversion layer includes a first red quantum dot layer 230 corresponding to the red sub-pixels, a first green quantum dot layer 240 corresponding to the green sub-pixels, a light transmitting layer 250 corresponding to the blue sub-pixels, and a yellow light conversion layer 260 corresponding to the white sub-pixels. The first red quantum dot layer 230 is configured to convert blue light emitted by the light-emitting device 110 of the corresponding sub-pixel to red light. The first green quantum dot layer 240 is configured to convert blue light emitted by the light-emitting device 110 of the corresponding sub-pixel to green light. The light transmitting layer 250 is configured to transmit blue light emitted by the light-emitting device 110 of the corresponding sub-pixel. The yellow light conversion layer 260 includes quantum dots and the quantum dots are configured to convert a portion of blue light emitted by the light-emitting device 110 of the corresponding sub-pixel to yellow light, and transmits the other portion of the blue light, such that the obtained yellow light and the blue light passing through the yellow light conversion layer 260 are mixed to form white light.

In the present disclosure, blue light is used as backlight of the sub-pixels. Red quantum dots of the first red quantum dot layer 230 convert blue light to red light such that the red sub-pixels display a red color. Green quantum dots of the first green quantum dot layer 240 convert blue light to green light such that the green sub-pixels display a green color. The light transmitting layer 250 is able to transmit blue light such that the blue sub-pixels display a blue color. The quantum dots of the yellow light conversion layer 260 can convert a portion of blue light into yellow light and can further transmit the other portion of the blue light, to mix the obtained yellow light and the transmitted blue light to become white light, such that the white sub-pixels display a white color. Thereby, R, G, B and W four-color display is realized, which greatly enhances the richness of color and display brightness, and enables the production of panels with higher resolution. Furthermore, no blue light filter is needed to be set on the white sub-pixels of the panel, which improves the utilization ratio of the blue backlight and simplifies the preparation processes.

The display panel according to the embodiments of the present disclosure will be described below in detail.

In the embodiments of the present disclosure, the substrate 100 may be a glass substrate, a plastic substrate, or other rigid or flexible substrates. A drive circuit for driving the OLED (not shown) may be provided on the substrate 100 as a drive backplane. The packaging layer 200 may be a packaging cover plate or a thin film packaging layer, and the packaging cover plate will be described below as an example.

A pixel definition layer 114 configured to define the above respective sub-pixels, specifically to define opening areas of the above respective sub-pixels, is provided on the substrate 100, and a light-emitting device 110 which can emit blue light is provided in each of the opening areas to provide backlight for the sub-pixels. In this exemplary embodiment, the light-emitting devices 110 are blue light-emitting organic electroluminescent devices 110 (hereinafter referred to as blue OLED devices). The organic electroluminescent devices 110 are self-luminous, with good chromaticity, high luminous efficiency, fast response speed and low power consumption, and can improve the luminous efficiency of the backlight.

Specifically, as shown in FIG. 1, the blue OLED devices may include an anode layer 111, a blue organic light-emitting material layer 112, a cathode layer 113, and may further include a hole transport layer, an electron transport layer, an electron injection layer, a hole injection layer, and other layers. The present disclosure does not impose any special limitations on this.

It can be understood that the configuration of the light-emitting device 110 is similar to that of a conventional OLED panel, the only difference is that each pixel unit of the conventional OLED panel is provided with three OLED devices (red, green and blue) while each pixel unit in this exemplary embodiment is provided with four blue OLED devices.

It should be noted that in the respective functional film layers of the blue OLED devices of the sub-pixels, the remaining functional film layers except for the anode layer may be formed entirely by an opening mask in order to reduce costs. However, the blue OLED devices of the respective sub-pixels can still control light emission individually by a thin film transistor connected to an anode. Therefore, the respective light-emitting devices can still be treated as a plurality of separate light-emitting devices. The blue OLED devices described below all refer to the separate light-emitting devices corresponding to the respective sub-pixels.

For the red sub-pixel, blue light emitted by the blue OLED device irradiates onto the first red quantum dot layer 230, and the red quantum dots in the first red quantum dot layer 230 are photoluminescent quantum dot materials that can convert the received blue light into red light to display a red color. For the green sub-pixels, blue light emitted by the blue OLED device irradiates onto the first green quantum dot layer 240 and the green quantum dots in the first green quantum dot layer 240 are photoluminescent quantum dot materials as well that can convert the received blue light into green light to display a green color.

Since the absorption of blue light by the quantum dots is directly related to the number of the quantum dots, the conversion efficiency is affected by the thickness of the quantum dot layer and the concentration of the quantum dots in the layer. Ideally, the conversion efficiency becomes higher along with the increase of the thickness of the quantum dot layer or the concentration of the quantum dots. However, in practice, the thickness of the quantum dot layer must be reduced to about 6 to 10 microns in order to meet the current thinner and thinner display requirement. Additionally, if the concentration of the quantum dots is too large, the quantum dots may aggregate, resulting in lower luminous efficiency; meanwhile, viscosity will become too large as the concentration is too large, which will affect the compatibility with inkjet printing devices. Furthermore, quantum dots have strong absorption of ultraviolet light, such that too high concentration of quantum dots will affect the curing performance of UV-curable inks. Due to the limitations on thickness and concentration, it is difficult for the quantum dot layer to realize 100% conversion rate. That is to say, there will still be a portion of blue light that will pass through the quantum dot layer for emission.

In this exemplary embodiment, a red light-filtering layer 221 is provided on the first red quantum dot layer 230 and a green light-filtering layer 222 is provided on the first green quantum dot layer 240, so as to prevent blue light leakage by the light-filtering layers, such that the color gamut that can be expressed by the light emitted from the sub-pixels of the two colors will be wider. In fact, the red light-filtering layer 221 and the green light-filtering layer 222 are provided on the packaging cover plate, and the correspondence between the light-emitting devices and the filtering layers is realized by forming paired box.

For the blue sub-pixels, since the blue OLED device emits blue light itself, there is no need to provide a conversion layer, but a light-transmitting layer 250 will be provided. It should be noted that the light-transmitting layer 250 may be an air layer or a transparent material layer. For example, a transparent polymer resin material such as acrylic may be used as the transparent material layer. To further improve the light outgoing efficiency of the blue sub-pixels, reflective particles that can reflect blue light to a light outgoing surface can be added in the transparent material layer.

For the white sub-pixels, blue light emitted from a blue OLED device irradiates onto the yellow light conversion layer 260, and the quantum dots in the yellow light conversion layer 260 can convert a portion of the received blue light to yellow light and further transmit the other portion of the blue light to mix the obtained yellow light and the transmitted blue light to become white light. Specifically, this embodiment may realize the mixing of yellow light and blue light in a variety of ways.

Figure 2:
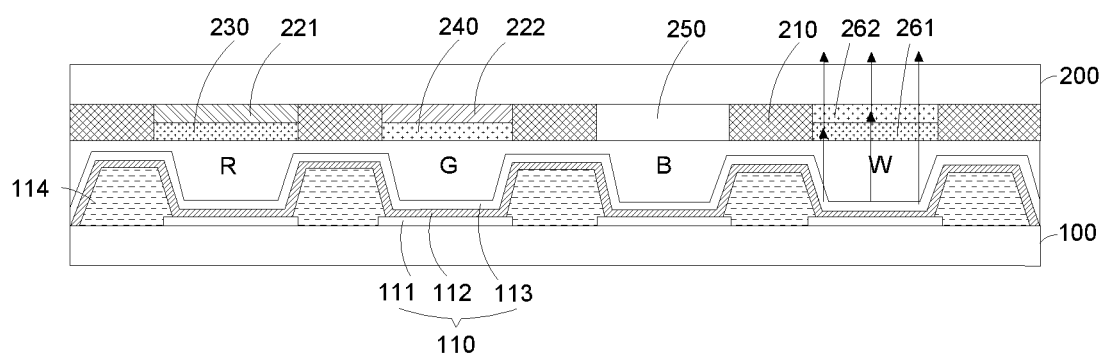
FIG. 2 is a structural schematic diagram illustrating a display panel according to a first exemplary embodiment.

FIG. 2 shows a first exemplary embodiment. In this embodiment, the yellow light conversion layer 260 includes a second red quantum dot layer 261 and a second green quantum dot layer 262 which are laminated in an order from bottom to top as shown in the figure. Namely, the second red quantum dot layer 261 is provided on one side of the blue OLED devices distal to the substrate 100, and the second green quantum dot layer 262 is provided on one side of the second red quantum dot layer 261 distal to the blue OLED devices.

The light emission process is as follows: the light emitted by the blue OLED device irradiates first onto the second red quantum dot layer 261 from bottom to top, and since the conversion rate will not reach 100%, the second red quantum dot layer 261 can convert a portion of the blue light to red light and at the same time transmit the other portion of the blue light; and the second green quantum dot layer 262 can convert the portion of the blue light passing through the second red quantum dot layer 261 to green light, and further transmit the other portion of the blue light that is not converted by the second red quantum dot layer 261. At the same time, since energy of red emission light is less than excitation energy of the green quantum dots, the second green quantum dot layer 262 cannot convert it to green light, but can transmit the red light. Finally, the red light and green light obtained by the conversion of the two quantum dot layers respectively are mixed to form yellow light, and the yellow light and the blue light not converted by the two quantum dot layers are mixed to form white light (i.e., approximate white light) to be emitted from the packaging layer 200.

Figure 5:
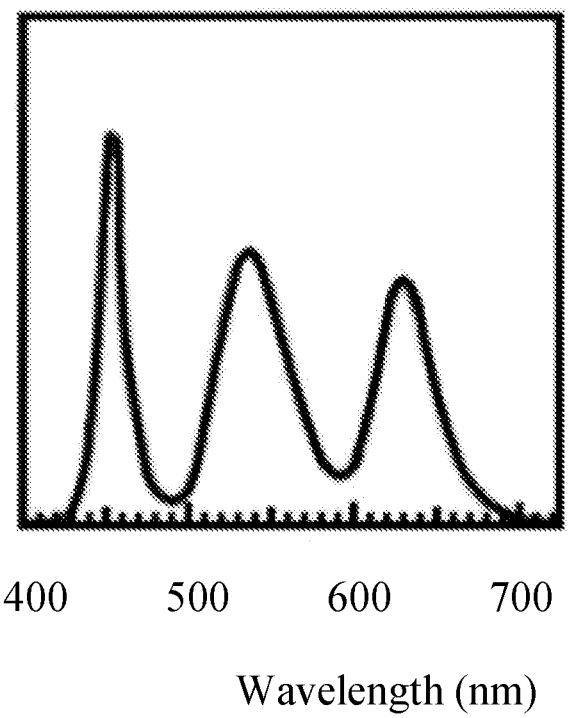
FIG. 5 is a diagram illustrating an emission spectrum of white light of the display panel according to the first exemplary embodiment.

FIG. 5 shows an emission spectrum of white light of the display panel according to this exemplary embodiment. It can be seen that the white light actually consists of red light, green light and blue light, which is a mixing effect.

Figure 3:
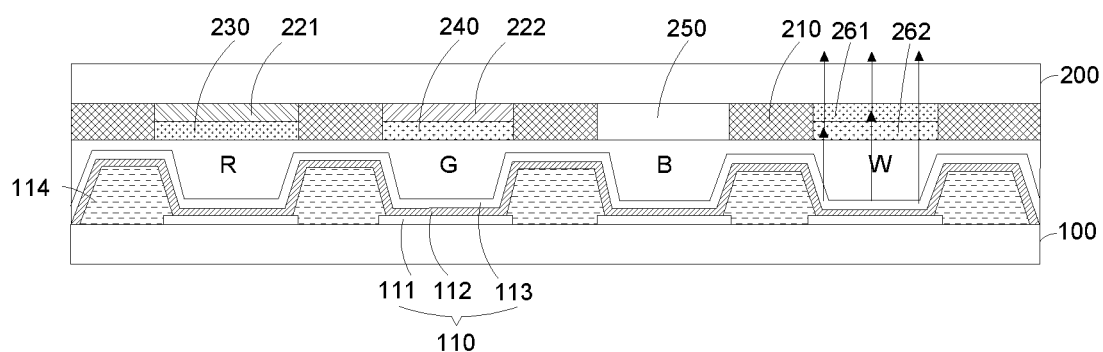
FIG. 3 is a structural schematic diagram illustrating a display panel according to a second exemplary embodiment.

FIG. 3 shows a second exemplary embodiment. In this embodiment, the yellow light conversion layer 260 includes a second green quantum dot layer 262 and a second red quantum dot layer 261 laminated in an order from bottom to top as shown in the figure. Namely, the second green quantum dot layer 262 is provided on one side of the blue OLED device distal to the substrate 100, and the second red quantum dot layer 261 is provided on one side of the second green quantum dot layer 262 distal to the blue OLED device.

The light emission process is as follows: the light emitted by the blue OLED device irradiates first onto the second green quantum dot layer 262 from bottom to top, and the second green quantum dot layer 262 can convert a portion of the blue light to green light and at the same time transmit the other portion of the blue light. The second red quantum dot layer 261 can convert a portion of the blue light passing through the second green quantum dot layer 262 to red light and further transmit the other portion of the blue light that is not converted by the second green quantum dot layer 262. Meanwhile, since energy of green emission light is higher than excitation energy of the red quantum dots, the second red quantum dot layer 261 will convert a portion of the green light to red light, and will further transmit the other portion of the green light. Finally, the red light and green light obtained by the conversion of the two quantum dot layers respectively are mixed to form yellow light, and then the yellow light and the blue light not converted by the two quantum dot layers are mixed to form white light (i.e., approximate white light) to be emitted from the packaging layer 200.

Compared with the first exemplary embodiment, in the second exemplary embodiment, the percentage of red light in the emitted white light is high since a portion of the green light is converted to red light by the second red quantum dot layer 261, whereas in the first exemplary embodiment, the percentage of both red and green light in the emitted white light is high since the red light cannot be converted by the second green quantum dot layer 262.

In the above-mentioned two exemplary embodiments, both layer thickness of the second red quantum dot layer 261 and the second green quantum dot layer 262 as well as the concentration of quantum dots in the layers will affect the conversion rate of red light or green light, thus affecting the percentage of light of the respective colors in the white light. Therefore, the layer thickness of the two quantum dot layers and the concentration of quantum dots in the layers need to be adjusted according to the requirements for white chromaticity in actual products.

In addition, since there is an overlap between the emission spectrum and the absorption spectrum of the green quantum dots, the phenomenon of self-absorption of the green light is significant and its conversion rate will be low, thus affecting the proportion of the green light in the white light. Reducing the thickness of the second green quantum dot layer 262 will be conducive to eliminating, the interference of the self-absorption of the green light, on the chromaticity of the emitted white light, and improving the white light outgoing effect. The interference of the green light self-absorption, on the chromaticity of the emitted white light, can be reduced by reducing the concentration of the quantum dots in the second green quantum dot layer 262. That is to say, the concentration of the green quantum dots in the second green quantum dot layer 262 is less than the concentration of the green quantum dots in the first green quantum dot layer 240. It should be emphasized that the said reducing the thickness or concentration of the second green quantum dot layer 262 here means that it is with respect to the first green quantum dot layer 240 in the green sub-pixels, that is, the thickness and/or concentration of the second green quantum dot layer 262 is less than that of the first green quantum dot layer 240.

For the red quantum dot layer, since there is no overlap between an emission spectrum and an absorption spectrum of the red quantum dots, no self-absorption phenomenon occurs, thus the thickness or the quantum dot concentration of the first red quantum dot layer 230 of the red sub-pixels may be equal to that of the second red quantum dot layer 261 of the white sub-pixels.

Figure 4:
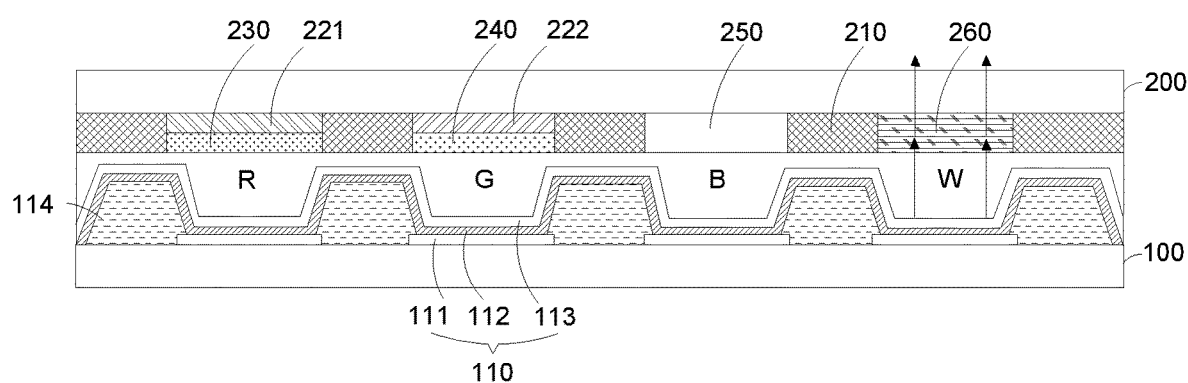
FIG. 4 is a structural schematic diagram illustrating a display panel according to a third exemplary embodiment.

FIG. 4 shows a third exemplary embodiment. In this embodiment, the yellow light conversion layer 260 includes a mixture of red quantum dots and green quantum dots, the red quantum dots are configured to convert a portion of blue light emitted by the blue OLED device to red light and further transmit another portion of the blue light, and the green quantum dots are configured to convert a portion of blue light emitted by the blue OLED device to green light and further transmit another portion of the blue light. Meanwhile, since energy of the emitted green light is higher than excitation energy of the red quantum dots, the red quantum dots will convert a portion of the green light to red light, and finally the red light and the green light obtained by the conversion of the mixed two quantum dots respectively are mixed to form yellow light, and then the yellow light and the blue light not converted by the quantum dots are mixed to form white light (i.e., approximate white light) to be emitted from the packaging layer 200.

In this exemplary embodiment, since a portion of the green light is converted to red light, the proportion of red light in the emitted white light is high. Since the concentration of the red quantum dots and the green quantum dots may affect the conversion rate of the red light or the green light, thus affecting the proportion of light of the respective colors in white light, the concentration of the two quantum dots can be adjusted according to the requirements for white chromaticity in actual products, so as to balance the proportions of the red light and green light as far as possible.

Meanwhile, in this exemplary embodiment, the concentration of the green quantum dots may be less than that of the green quantum dots in the first green quantum dot layer 240, thereby reducing, the interference of green light self-absorption, on the chromaticity of the emitted white light in the white sub-pixels, thus improving the white light outgoing effect.

A fourth exemplary embodiment is shown in FIG. 1, wherein a yellow light conversion layer 260 includes yellow quantum dots, and the yellow quantum dots are configured to convert a portion of blue light emitted by the light-emitting device 110 to yellow light, and at the same time transmit the other portion of blue light, such that the obtained yellow light and the blue light passing through the yellow light conversion layer 260 are mixed to form white light. Finally, the yellow light obtained by the conversion of the quantum dots and the blue light not converted by the quantum dots are mixed to form white light (i.e., approximate white light) to be emitted from the packaging layer 200.

In this exemplary embodiment, the concentration of yellow quantum dots may affect the conversion rate of the yellow light, thus affecting the proportion of light of the respective colors in white light. Therefore, the concentration of the yellow quantum dots needs to be adjusted according to the requirements for white chromaticity in the actual product.

In some exemplary embodiments, the packaging layer may be a packaging cover plate, thus the light conversion layer may be formed on the packaging cover plate, and then the packaging cover plate and the substrate form a display panel by forming paired box.

Referring to FIGS. 1-4, a black mask (BM) 210 may further be provided on one side of the packaging cover plate toward the substrate 100. The black mask 210 includes a plurality of light-shielding portions, each of which is located between the filtering layers of two adjacent sub-pixels, for preventing light crosstalk in the quantum dot layers of the adjacent sub-pixels.

Figure 6:
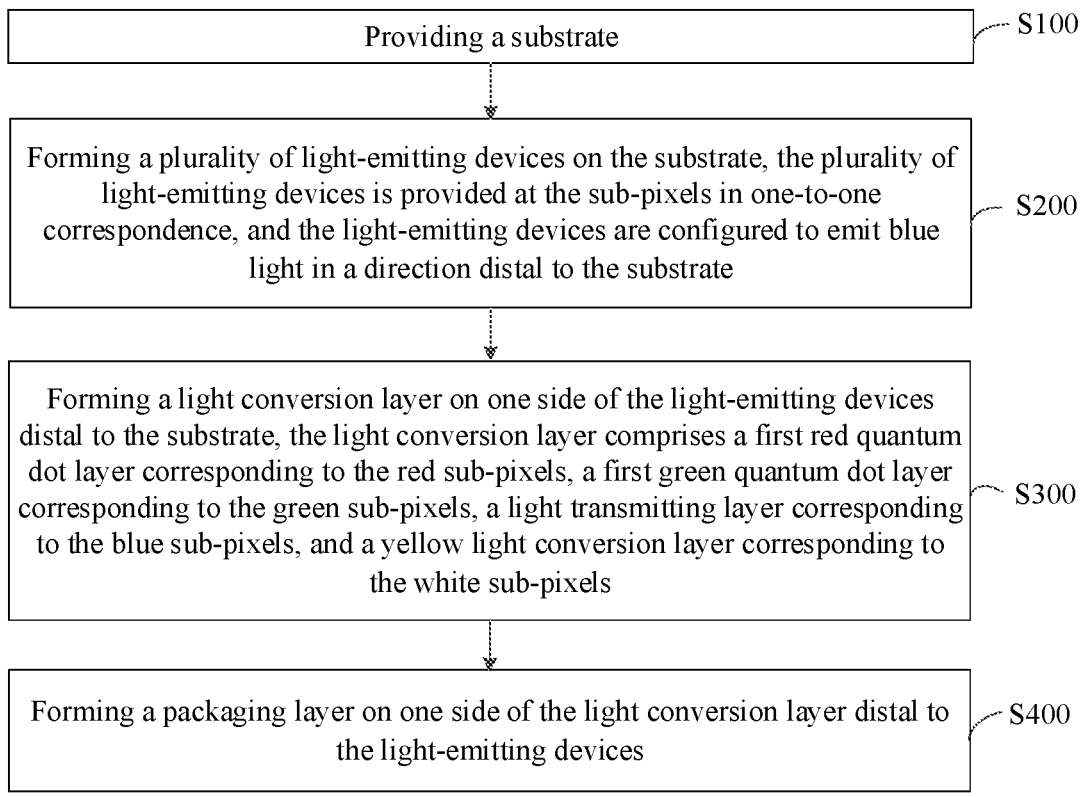
FIG. 6 is a flow chart showing a method for fabricating a display panel according to an embodiment of the present disclosure.

An embodiment of the present disclosure further provides a method for fabricating the above-mentioned display panel. Referring to FIG. 6, the method includes the following steps:

In step S100, a substrate 100 may be provided.

In step S200, a plurality of light-emitting devices 110 may be formed on the substrate 100. The plurality of light-emitting devices 110 may be provided at respective sub-pixels in one-to-one correspondence, and may be configured to emit blue light in a direction distal to the substrate 100.

In step S300, a light conversion layer may be formed on one side of the light-emitting device 110 distal to the substrate. The light conversion layer includes a first red quantum dot layer 230 corresponding to red sub-pixels, a first green quantum dot layer 240 corresponding to green sub-pixels, a light transmitting layer 250 corresponding to blue sub-pixels, and a yellow light conversion layer 260 corresponding to white sub-pixels. The first red quantum dot layer 230 is configured to convert blue light emitted by the light-emitting device 110 of the corresponding sub-pixel into red light. The first green quantum dot layer 240 is configured to convert blue light emitted by the light-emitting device 110 of the corresponding sub-pixel into green light. The light-transmitting layer 250 is configured to transmit blue light emitted by the light-emitting device 110 of the corresponding sub-pixel. The yellow light conversion layer 260 includes quantum dots, and the quantum dots are configured to convert a portion of blue light emitted by the light-emitting device 110 of the corresponding sub-pixel to yellow light, and at the same time transmit the other portion of the blue light, such that the obtained yellow light and the blue light passing through the yellow light conversion layer 260 are mixed to form white light.

In step S400, a packaging layer 200 is formed on one side of the light conversion layer distal to the light-emitting device 110.

In this embodiment, the substrate 100 in the step S100 may be provided with TFT arrays and driver circuits in advance, to realize separate control of the respective light-emitting devices 110.

In this embodiment, the respective film layers of the light-emitting devices 110 in the step S200 may be formed by using various methods such as spin coating, vapor deposition, ink jet printing, magnetron sputtering, etc. For actual products, after the blue OLED devices are fabricated, film layers such as a planarization layer, a packaging layer (not shown), etc., may be further formed on the light-emitting devices 110 for protecting the light-emitting devices 110 from water and oxygen intrusion.

In step S300 of this embodiment, a patterned quantum dot layer may be formed by using inkjet printing, photolithography or the like. In an exemplary embodiment, in the step S400, a packaging cover plate may be employed as the packaging layer and the light conversion layer may be formed on the packaging cover plate. Before the light conversion layer is formed, a black mask 210 located between adjacent sub-pixels is first formed on the packaging cover plate, and then a red filtering layer 221 corresponding to the red sub-pixels and a green filtering layer 222 corresponding to the green sub-pixels are formed. Next, the first red quantum dot layer 230 is formed on one side of the red filtering layer 221 distal to the packaging cover plate, and the first green quantum dot layer 240 is formed on one side of the green filtering layer 222 distal to the packaging cover plate. Since the thickness and/or concentration of the second green quantum dot layer 262 is less than that of the first green quantum dot layer 240, the two quantum dot layers cannot be formed simultaneously. However, the thickness or quantum dot concentration of the first red quantum dot layer 230 may be equal to that of the second red quantum dot layer 261, so they may be formed synchronously, but they can be fabricated in two steps. The light transmitting layer 250 of the blue sub-pixels may be patterned by using processes such as inkjet printing or photolithography, etc., as well.

After the light conversion layer is manufactured on the packaging cover plate, a thin film packaging layer (not shown in the figures) may be further formed on the light conversion layer (the surface facing toward the light-emitting device 110 in the figures) to protect the quantum dot materials from oxidation.

Finally, the substrate 100 on which the light-emitting devices are formed and the packaging cover plate on which the filtering layer, the black mask and the light conversion layer are formed, are provided opposite to each other to form a paired box, thus forming a complete display panel.

In other exemplary embodiments, the packaging layer 200 in the step S400 may be in a form of a thin film package as well, then the light conversion layer and the filtering layer need to be formed within opening areas of the sub-pixels, and then the light conversion layer and the filtering layer are protected by the thin film packaging layer, so as to further decrease the thickness of the display panel. The light conversion layer may be formed by inkjet printing, photolithography or the like, as well, but in these processes, the difficulty in forming the light conversion layer is higher.

It should be noted that the serial numbers of the above-mentioned steps are for convenience of description only and not for limitation on the orders of the steps, and the person skilled in the art can totally adjust the orders according to the actual processes.

An embodiment of the present disclosure further provides a display device that includes a quantum dot-based display panel according to the above-mentioned embodiments. The display device has the above-mentioned display panel, so it has the same beneficial effects, which will not be elaborated in the present disclosure.

The present disclosure does not impose any specific limitations on the usage of the display device, which may be any products or components having display functions such as televisions, laptops, tablet PCs, wearable display apparatuses, mobile phones, car monitors, navigators, e-books, digital photo frames, advertising light boxes.

Other embodiments of the disclosure will be apparent to those skilled in the art from consideration of the specification and practice of the disclosure disclosed here. This disclosure is intended to cover any variations, uses, or adaptations of the disclosure following the general principles of the present disclosure and including such departures from the present disclosure as come within known or customary practice in the art. It is intended that the specification and examples be considered as exemplary only, with a true scope and spirit of the disclosure being indicated by the following claims.

What is claimed is:

1. A quantum dot-based display panel comprising pixels arranged in an array, at least a portion of the pixels comprises red sub-pixels, green sub-pixels, blue sub-pixels and white sub-pixels, and the quantum dot-based display panel further comprises:

a substrate;

a packaging layer provided opposite to the substrate;

a plurality of light-emitting devices disposed between the substrate and the packaging layer, and provided at the respective sub-pixels in one-to-one correspondence, wherein the light-emitting devices is configured to emit blue light toward the packaging layer; and a light conversion layer provided between the light-emitting devices and the packaging layer, wherein the light conversion layer comprises a first red quantum dot layer corresponding to the red sub-pixels, a first green quantum dot layer corresponding to the green sub-pixels, a light transmitting layer corresponding to the blue sub-pixels, and a yellow light conversion layer corresponding to the white sub-pixels;

wherein the first red quantum dot layer is configured to convert blue light emitted by the light-emitting device of the corresponding sub-pixel to red light, the first green quantum dot layer is configured to convert blue light emitted by the light-emitting device of the corresponding sub-pixel to green light, the light transmitting layer is configured to transmit blue light emitted by the light-emitting device of the corresponding sub-pixel, and the yellow light conversion layer comprises quantum dots and the quantum dots are configured to convert a portion of blue light emitted by the light-emitting device of the corresponding sub-pixel to yellow light, and at the same time transmit the other portion of the blue light, to mix the obtained yellow light and the blue light transmitting through the yellow light conversion layer to form white light.

2. The display panel according to claim 1, wherein the light transmitting layer is one of an air layer, a transparent material layer, and a transparent material layer in which reflective particles for reflecting blue light to a light outgoing surface are added.

3. The display panel according to claim 2, wherein the yellow light conversion layer comprises a second red quantum dot layer and a second green quantum dot layer that are laminated; the second red quantum dot layer is configured to convert a portion of blue light emitted by the light-emitting device of a corresponding sub-pixel to red light and at the same time transmit the other portion of the blue light; the second green quantum dot layer is configured to convert a portion of the blue light emitted by the light-emitting device of the corresponding sub-pixel to green light and at the same time transmit the other portion of the blue light, such that the obtained red light and green light are mixed to form yellow light, and the yellow light and blue light transmitting through the yellow light conversion layer are mixed to form white light.

4. The display panel according to claim 3, wherein the second red quantum dot layer is provided on one side of the light-emitting device distal to the substrate, and the second green quantum dot layer is provided on one side of the second red quantum dot layer distal to the light-emitting device;

wherein the second red quantum dot layer is configured to convert a portion of the blue light emitted by the light-emitting device of the corresponding sub-pixel to red light and at the same time transmit the other portion of the blue light; the second green quantum dot layer is configured to convert a portion of the blue light transmitting through the second red quantum dot layer of the corresponding sub-pixel to green light, and at the same time transmit the other portion of the blue light and transmit the red light emitted by the second red quantum dot layer such that the obtained red light and green light are mixed to form yellow light, and the yellow light and the blue light transmitting through the yellow light conversion layer are mixed to form white light.

5. The display panel according to claim 3, wherein the second green quantum dot layer is provided on one side of the light-emitting device distal to the substrate and the second red quantum dot layer is provided on one side of the second green quantum dot layer distal to the light-emitting device;

wherein the second green quantum dot layer is configured to convert a portion of the blue light emitted by the light-emitting device of the corresponding sub-pixel to green light and at the same time transmit the other portion of the blue light; the second red quantum dot layer is configured to convert a portion of the blue light transmitting through the second green quantum dot layer of the corresponding sub-pixel to red light, and convert a portion of the green light emitted by the second green quantum dot layer to red light, and at the same time transmit the other portion of the green light and the other portion of the blue light, such that the obtained red light and green light are mixed to form yellow light, and the yellow light and the blue light transmitting through the yellow light conversion layer are mixed to form white light.

6. The display panel according to claim 2, wherein the yellow light conversion layer comprises mixed red quantum dots and green quantum dots, the green quantum dots are configured to convert a portion of blue light emitted by the light-emitting device of a corresponding sub-pixel to green light and at the same time transmit another portion of the blue light, and the red quantum dots are configured to convert a portion of blue light emitted by the light-emitting device of a corresponding sub-pixel to red light and convert a portion of the green light emitted by the green quantum dots to red light and at the same time transmit another portion of the blue light, such that the obtained red light and green light are mixed to form yellow light, and the yellow light and the blue light transmitting through the yellow light conversion layer are mixed to form white light.

7. The display panel according to claim 2, wherein the yellow light conversion layer comprises yellow quantum dots, the yellow quantum dots being configured to convert a portion of blue light emitted by the light-emitting device of a corresponding sub-pixel to yellow light, and at the same time transmit the other portion of the blue light, such that the obtained yellow light and the blue light transmitting through the yellow light conversion layer are mixed to form white light.

8. The display panel according to any one of claims 3, wherein a thickness of the second green quantum dot layer is less than that of the first green quantum dot layer, or, a concentration of green quantum dots in the second green quantum dot layer is less than that of green quantum dots in the first green quantum dot layer.

9. The display panel according to any one of claims 4, wherein a thickness of the second green quantum dot layer is less than that of the first green quantum dot layer, or, a concentration of green quantum dots in the second green quantum dot layer is less than that of green quantum dots in the first green quantum dot layer.

10. The display panel according to any one of claims 5, wherein a thickness of the second green quantum dot layer is less than that of the first green quantum dot layer, or, a concentration of green quantum dots in the second green quantum dot layer is less than that of green quantum dots in the first green quantum dot layer.

11. The display panel according to claim 6, wherein a concentration of green quantum dots in the yellow light conversion layer is less than that of green quantum dots in the first green quantum dot layer.

12. The display panel according to claim 1, wherein the packaging layer is a packaging cover plate, and the light conversion layer is provided on one side of the packaging cover plate, facing toward the substrate.

13. The display panel according to claim 12, wherein the display panel further comprises:
- a filtering layer comprising a red filtering layer corresponding to the red sub-pixels and a green filtering layer corresponding to the green sub-pixels, wherein the red filtering layer is provided between the first red quantum dot layer and the packaging cover plate, and the green filtering layer is provided between the first green quantum dot layer and the packaging cover plate.

14. The display panel according to claim 13, wherein the display panel further comprises:
- a black mask provided on one side of the packaging cover plate, facing toward the substrate, wherein the black mask comprises a plurality of shielding portions, and each of the plurality of shielding portions is located between adjacent sub-pixels.

15. A display device, comprising:
- a quantum dot-based display panel, wherein the display panel comprises pixels arranged in an array, at least a portion of the pixels comprises red sub-pixels, green sub-pixels, blue sub-pixels and white sub-pixels, and the quantum dot-based display panel further comprises:
    - a substrate;
    - a packaging layer provided opposite to the substrate;
    - a plurality of light-emitting devices, disposed between the substrate and the packaging layer, and provided at the respective sub-pixels in one-to-one correspondence, wherein the light-emitting devices is configured to emit blue light toward the packaging layer; and
    - a light conversion layer provided between the light-emitting devices and the packaging layer, wherein the light conversion layer comprises a first red quantum dot layer corresponding to the red sub-pixels, a first green quantum dot layer corresponding to the green sub-pixels, a light transmitting layer corresponding to the blue sub-pixels, and a yellow light conversion layer corresponding to the white sub-pixels;
    - wherein the first red quantum dot layer is configured to convert blue light emitted by the light-emitting device of the corresponding sub-pixel to red light, the first green quantum dot layer is configured to convert blue light emitted by the light-emitting device of the corresponding sub-pixel to green light, the light transmitting layer is configured to transmit blue light emitted by the light-emitting device of the corresponding sub-pixel, and the yellow light conversion layer comprises quantum dots and the quantum dots are configured to convert a portion of blue light emitted by the light-emitting device of the corresponding sub-pixel to yellow light, and at the same time transmit the other portion of the blue light, to mix the obtained yellow light and the blue light transmitting through the yellow light conversion layer to form white light.

16. The display device according to claim 15, wherein the light transmitting layer is one of an air layer, a transparent material layer, and a transparent material layer in which reflective particles for reflecting blue light to a light outgoing surface are added.

17. The display device according to claim 16, wherein the yellow light conversion layer comprises a second red quantum dot layer and a second green quantum dot layer that are laminated; the second red quantum dot layer is configured to convert a portion of blue light emitted by the light-emitting device of a corresponding sub-pixel to red light and at the same time transmit the other portion of the blue light; the second green quantum dot layer is configured to convert a portion of the blue light emitted by the light-emitting device of the corresponding sub-pixel to green light and at the same time transmit the other portion of the blue light, such that the obtained red light and green light are mixed to form yellow light, and the yellow light and blue light transmitting through the yellow light conversion layer are mixed to form white light.

18. The display device according to claim 17, wherein the second red quantum dot layer is provided on one side of the light-emitting device distal to the substrate, and the second green quantum dot layer is provided on one side of the second red quantum dot layer distal to the light-emitting device;
- wherein the second red quantum dot layer is configured to convert a portion of the blue light emitted by the light-emitting device of the corresponding sub-pixel to red light and at the same time transmit the other portion of the blue light; the second green quantum dot layer is configured to convert a portion of the blue light transmitting through the second red quantum dot layer of the corresponding sub-pixel to green light, and at the same time transmit the other portion of the blue light and transmit the red light emitted by the second red quantum dot layer such that the obtained red light and green light are mixed to form yellow light, and the yellow light and the blue light transmitting through the yellow light conversion layer are mixed to form white light.

\* \* \* \* \*